(12) United States Patent
Cheng et al.

(10) Patent No.: US 12,017,322 B2
(45) Date of Patent: Jun. 25, 2024

(54) CHEMICAL MECHANICAL POLISHING METHOD

(71) Applicant: TAIWAN SEMICONDUCTOR MANUFACTURING CO., LTD., Hsinchu (TW)

(72) Inventors: Wei-Chang Cheng, Taichung (TW); Chi-Hung Liao, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 1390 days.

(21) Appl. No.: 16/210,830

(22) Filed: Dec. 5, 2018

(65) Prior Publication Data

US 2020/0055160 A1 Feb. 20, 2020

Related U.S. Application Data

(60) Provisional application No. 62/718,939, filed on Aug. 14, 2018.

(51) Int. Cl.
*B24B 37/015* (2012.01)
*B24B 37/24* (2012.01)
*B24B 37/32* (2012.01)
*H01L 21/321* (2006.01)
*H01L 21/67* (2006.01)

(52) U.S. Cl.
CPC .......... *B24B 37/015* (2013.01); *B24B 37/245* (2013.01); *B24B 37/32* (2013.01); *H01L 21/3212* (2013.01); *H01L 21/67219* (2013.01)

(58) Field of Classification Search
None
See application file for complete search history.

(56) References Cited

U.S. PATENT DOCUMENTS

| | | | | |
|---|---|---|---|---|
| 5,605,488 A | * | 2/1997 | Ohashi | B24B 37/30 451/259 |
| 5,851,846 A | * | 12/1998 | Matsui | H01L 21/31053 438/692 |
| 6,048,256 A | * | 4/2000 | Obeng | B24B 37/04 451/60 |
| 6,110,012 A | * | 8/2000 | Maury | B24B 57/02 451/36 |
| 6,225,224 B1 | * | 5/2001 | Pandey | B24B 57/02 438/692 |
| 6,325,696 B1 | * | 12/2001 | Boggs | B24B 49/16 451/6 |

(Continued)

FOREIGN PATENT DOCUMENTS

| | | |
|---|---|---|
| CN | 1857865 A | 11/2006 |
| CN | 1970229 A | 5/2007 |

(Continued)

*Primary Examiner* — Sylvia MacArthur
(74) *Attorney, Agent, or Firm* — Maschoff Brennan

(57) ABSTRACT

A chemical mechanical polishing method includes holding a wafer in a carrier over a polishing pad, dispensing a first slurry comprising a plurality of first abrasive particles into the carrier, rotating at least one of the carrier and the polishing pad, halting the dispensing of the first slurry, and dispensing a second slurry into the carrier after halting the dispensing of the first slurry, wherein the second slurry comprises a plurality of second abrasive particles smaller than the first abrasive particles.

20 Claims, 8 Drawing Sheets

(56) References Cited

U.S. PATENT DOCUMENTS

| | | | | |
|---|---|---|---|---|
| 6,660,124 | B1 * | 12/2003 | Kawasaki | B08B 3/08 |
| | | | | 216/85 |
| 6,890,402 | B2 * | 5/2005 | Gunji | B24B 37/32 |
| | | | | 451/9 |
| 7,166,018 | B2 * | 1/2007 | Tanoue | B24B 37/04 |
| | | | | 451/60 |
| 7,456,668 | B2 * | 11/2008 | Nakanishi | H03F 3/217 |
| | | | | 327/172 |
| 7,840,305 | B2 * | 11/2010 | Behr | B24B 37/04 |
| | | | | 700/173 |
| 10,510,563 | B2 * | 12/2019 | Wu | B24B 37/32 |
| 10,710,208 | B2 * | 7/2020 | Maruyama | B24B 55/02 |
| 2005/0164606 | A1 * | 7/2005 | Benner | B24B 49/18 |
| | | | | 451/41 |
| 2006/0205323 | A1 * | 9/2006 | Togawa | B24B 55/02 |
| | | | | 451/7 |
| 2006/0264157 | A1 * | 11/2006 | Hashii | H01L 21/02024 |
| | | | | 451/41 |
| 2008/0004743 | A1 * | 1/2008 | Goers | B24B 53/017 |
| | | | | 700/121 |
| 2010/0279435 | A1 * | 11/2010 | Xu | B24B 55/02 |
| | | | | 156/345.13 |
| 2012/0058709 | A1 * | 3/2012 | Fukushima | B24B 37/10 |
| | | | | 451/364 |
| 2017/0239778 | A1 | 8/2017 | Maruyama et al. | |
| 2017/0297163 | A1 * | 10/2017 | Bajaj | H01L 21/67075 |
| 2019/0054590 | A1 * | 2/2019 | Huang | B24B 37/042 |
| 2020/0055160 | A1 * | 2/2020 | Cheng | H01L 21/3212 |

FOREIGN PATENT DOCUMENTS

| | | | | |
|---|---|---|---|---|
| CN | 1972780 | A | 5/2007 | |
| CN | 202088088 | U | 12/2011 | |
| CN | 104471685 | A | 3/2015 | |
| CN | 107097145 | A | 8/2017 | |
| EP | 0896859 | A2 * | 2/1999 | |
| EP | 1197292 | A | 4/2002 | |
| JP | 2009202325 | A | 9/2009 | |
| TW | 394721 | B | 6/2000 | |
| TW | 201429626 | A | 8/2014 | |
| TW | 201736043 | A | 10/2017 | |
| WO | WO-0218101 | A2 * | 3/2002 | B24B 37/16 |
| WO | WO-03064108 | A1 * | 8/2003 | B24B 37/30 |

* cited by examiner

CHEMICAL MECHANICAL POLISHING METHOD

PRIORITY CLAIM AND CROSS-REFERENCE

This application claims priority to U.S. Provisional Application Ser. No. 62/718,939, filed Aug. 14, 2018, which is herein incorporated by reference.

BACKGROUND

Chemical mechanical polishing (CMP) systems place a semiconductor wafer in contact with a polishing pad that moves relative to the semiconductor wafer. The semiconductor wafer may be stationary or it may also rotate on a carrier that holds the wafer. Between the semiconductor wafer and the polishing pad, CMP systems may use slurry. The slurry is a liquid having the ability to lubricate the moving interface between the semiconductor wafer and the polishing pad while mildly abrading and polishing the semiconductor wafer surface with a polishing agent.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
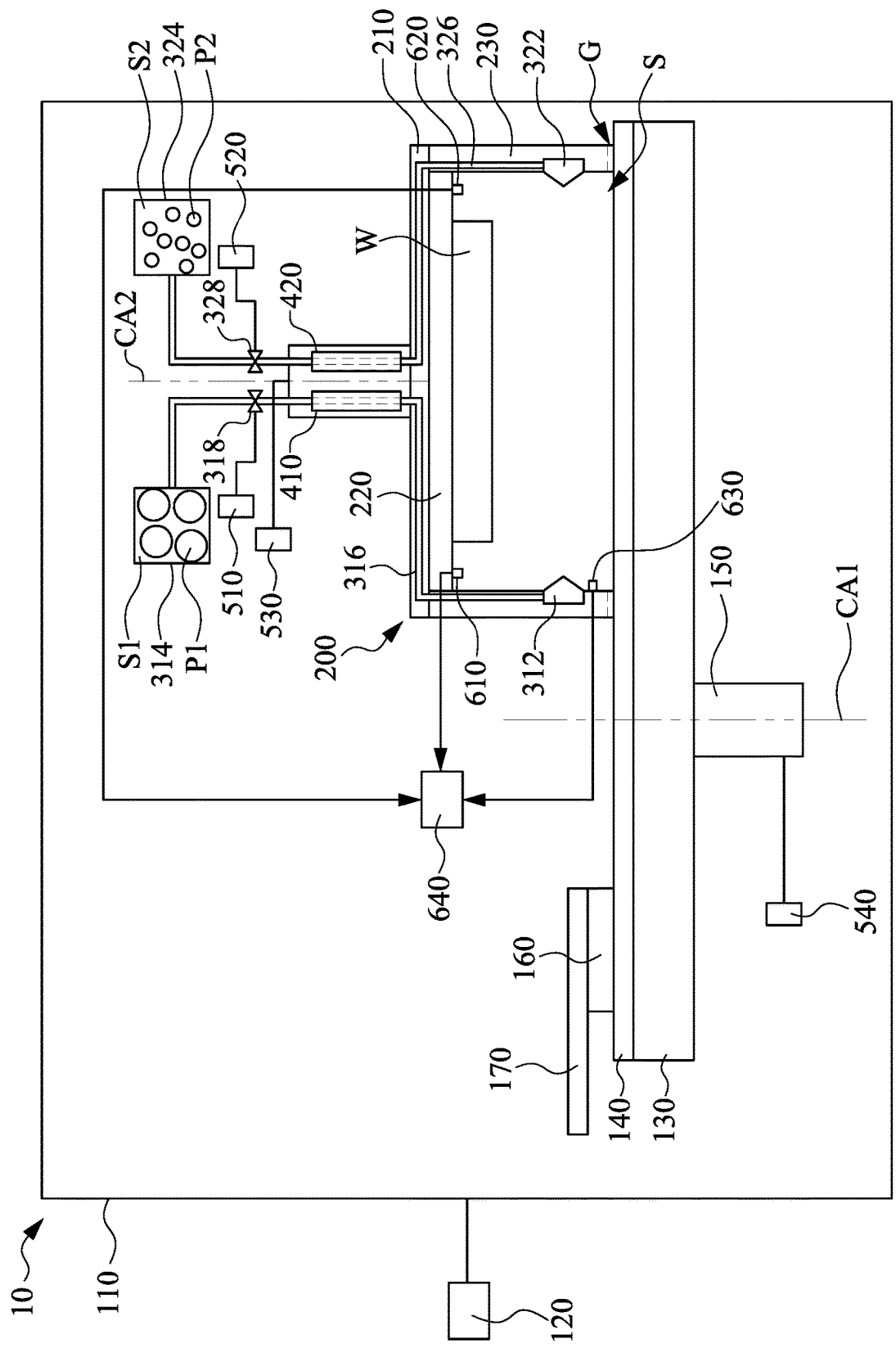
FIG. 1 is a side view of a CMP tool 10 in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present application which are now described in detail provide novel methods and apparatus for manufacturing semiconductor devices including performing chemical mechanical polishing on layers while detecting polishing conditions in real time in CMP processing and tuning a slurry recipe in response to the real-time detection result. In this manner, the polish performance can be improved.

Semiconductor processing often uses CMP processes. Without limiting the embodiments, example processing steps for CMP are to remove materials, to planarize deposited layers or even wafer surfaces, and to pattern and remove excess electroplated metal conductors in damascene processes, for example. In one example CMP process, shallow trench isolation regions ("STI") may be formed by etching trenches into a semiconductor substrate. Dielectric may be deposited in the trenches to form the STI regions. In forming the STI regions, the dielectric is deposited until the trenches are filled and then overfilled, so that the excess dielectric forms a layer over the substrate. A CMP polishing step is then performed to planarize the STI regions and the substrate; and the result is that the tops of the STI regions are left coplanar with the surface of the semiconductor substrate.

Interlevel dielectric ("ILD") layers may be formed over planar transistors disposed on the substrate, for example. The ILD dielectric is conformally deposited and thus portions of the ILD that are formed over a higher structure, such as over the gate conductor, will result in a correspondingly higher portion of the deposited ILD. Again a CMP process may be performed to polish the ILD layer and remove the high portions, thus planarizing the ILD layer; forming a planar surface needed or desirable for additional processing steps.

Metal layers for conductors are formed in single or dual damascene processing steps. First level metal or "M1" layer conductors may be formed from a single damascene copper or copper alloy, aluminum or other conductor. The copper is electroplated into a trench within a dielectric layer. During electroplating the copper fills and then overfills the trench. Because chemical etchants and other etch processes are ineffective in patterning copper, another chemical mechanical polishing process is used with an abrasive slurry and a pad to mechanically remove the excess copper. An inlaid conductor is the result, formed within the trench and surrounded by the dielectric layer. The finished conductor has a polished upper surface that is coplanar with a surface of the surrounding dielectric.

Accordingly, CMP processing is used repeatedly in semiconductor processing to form integrated circuits on semiconductor substrates. Referring first to FIG. 1, a diagram is shown of a CMP tool (or apparatus) 10 in accordance with some embodiments of the present disclosure. Components of the CMP tool 100 relevant to the present disclosure are illustrated. The CMP tool 100 may also include other components that are not shown. The CMP tool 100 may also include other stations than a polishing station, for example, such as a cleaning station, a drying station, or other types of stations.

The CMP tool 10 includes a housing 110 which provides a sealed, contained system for components of the CMP tool 10 in some embodiments, for example. A load port 120 is coupled to the housing 110 which allows for insertion of a wafer W or wafers into the CMP tool 10. The CMP tool 10 may also include a plurality of load ports 120 coupled to the housing 102.

The wafer W comprises a production wafer or a patterned wafer in some embodiments. The wafer W may also comprise other types of wafers W, such as a test wafer. The wafer W may be a semiconductor wafer comprising, for example, a semiconductor substrate (e.g., comprising silicon although other III-V semiconductor materials may be used as well), active devices (e.g., transistors) disposed at a top surface of the semiconductor structure, and/or various interconnect structures. The interconnect structure may include conductive features, which electrically connect the active devices in order to form functional circuits. In various embodiments, CMP processing may be applied to the wafer W during any stage of manufacture in order to planarize, reduce, or remove features (e.g., dielectric material, semiconductor material, and/or conductive material) of the wafer W. Thus, the wafer W being processed may include any subset of the above features as well as other features.

The CMP tool 10 includes a platen 130 that is adapted to support a polishing pad 140. During a CMP process, the polishing pad 140 and platen 130 are rotatable about a central axis CA1 of a shaft 150 connected to the platen 130 by a platen controller 540 coupled to the shaft 150, for example. The platen 130 and the polishing pad 140 are larger than the wafer W in some embodiments. The polishing pad 140 is removable and is attached to the platen 130 by an adhesive film, adhesive, or glue in some embodiments. The polishing pad 140 may also be coupled to the platen 130 by other means. A heater or heaters, not shown, may be disposed beneath the platen 130 to increase the temperature of the platen 130 during a CMP process.

The CMP tool 10 includes a diamond disk 160 coupled to a movable arm 170. The diamond disk 160 includes embedded or encapsulated cut diamond particles on a substrate. The diamond disk 160 includes or is coupled to a mechanism (not shown) that is adapted to rotate the diamond disk 160. The diamond disk 160 is used to dress the polishing pad 140 surface, e.g., to remove polishing by-products. The diamond disk 160 is a diamond conditioning tool that also shapes the polishing pad 140 and affects the polishing pad 140 surface roughness and polishing pad 140 life in some embodiments, for example.

The CMP tool 10 includes a wafer carrier 200 that is adapted to retain the wafer W during a CMP process, for example. The wafer carrier 200 is rotatable about a central axis CA2 of the wafer carrier 200 by a carrier controller 530 coupled thereto. The wafer carrier 200 may include a line, hose, or tube for a vacuum which may be used for picking up and retaining the wafer W while moving the wafer W to various stations of the CMP tool 10 and during the CMP process. The wafer W comprises a patterned layer of material disposed thereon that needs planarizing, smoothing, or a reduction in thickness, for example. The wafer W may be picked up by the wafer carrier 200 using the vacuum from the load port 120, and the first carrier 200 moves the wafer W to the polishing pad 140, and lowers and presses the wafer W against the polishing pad 140 for a CMP process. After the CMP process is complete, the wafer W is lifted again by the vacuum, and the wafer W is returned to the load port 120 or to another station in the CMP tool 10.

In some embodiments, the wafer carrier 200 includes a carrier head 210, a backing film 220 under the carrier head 210 and a retaining ring 230 around the backing film 110. The retaining ring 230 is mounted to the carrier head 210 using mechanical fasteners such as screws or by any other suitable means. In some embodiments, the backing film 220 is a flexible membrane to provide a substantially flat surface for securing the wafer W to the carrier head 210.

Positive pressure is provided to a backside surface of the flexible membrane 30 through the carrier head 210 in order to help maintain a substantially flat surface for supporting the wafer W and to evenly distribute pressure applied to the wafer W. A vacuum is able to be applied to the back surface of flexible membrane 220 through the carrier head 210 in order to help pick up the wafer W. The wafer W is secured in carrier head 210 such that retaining ring 220 surrounds the wafer W. In some embodiments, the retaining ring 230 is in contact with the polishing pad 140 but allows small gaps G between the retaining ring 230 and the polishing pad 140.

The CMP tool 10 includes first and second nozzles 312, 322 disposed on the retaining ring 230 and first and second slurry sources 314, 324 fluidly connected to the first and second nozzles 312, 322, respectively. For example, the first slurry source 314 is fluidly connected to the first nozzle 312 through a first pipe 316, and the second slurry source 324 is fluidly connected to the second nozzle 322 through a second pipe 326. In this way, the first nozzle 312 can dispense a first slurry S1 received from the first slurry source 314 into the wafer carrier 200 and onto the polishing pad 140, and the second nozzle 322 can dispense a second slurry S2 received from the second slurry source 324 into the wafer carrier 200 and onto the polishing pad 140.

In some embodiments, the first slurry source 314 is, for example, a slurry tank containing the first slurry S1 that includes a liquid having a suspension of first abrasive particles P1, and the second slurry source 324 is, for example, a slurry tank containing the second slurry S2 that includes a liquid having a suspension of second abrasive particles P2. The first abrasive particles P1 are larger than the second abrasive particles P2. That is, the first abrasive particles P1 have sizes greater than sizes of the second abrasive particles P2. For example, the first abrasive particles P1 have a mean diameter from about 5 nm to about 50 nm, and the second abrasive particles P2 have a mean diameter from about 51 nm to about 100 nm. Therefore, the larger abrasive particles P1 can be used to performed coarse polishing, and the smaller abrasive particles P2 can be used to performed fine polishing. In some embodiments, the first and second abrasive particles P1 and P2 comprise the same materials, such as $SiO_2$ or $Al_2O_3$. In some embodiments, the first abrasive particles P1 have different materials than the second abrasive particles P2. For example, the first abrasive particles P1 may be $SiO_2$, and the second abrasive particles P2 may be $Al_2O_3$. In some embodiments, the first abrasive particles P1 are suspended in in an aqueous solution of hydrogen peroxide and nitric acid on the first slurry supply S1, and the second abrasive particles P1 are suspended in in an aqueous solution of hydrogen peroxide and nitric acid on the second slurry supply S2. The hydrogen peroxide can oxidize a surface that is being polished thereby forming a brittle layer of oxide that is readily dislodged by the suspended abrasive particles.

In some embodiments, the CMP tool 10 includes first and second heaters 410 and 420 thermally coupled to the first and second pipes 316 and 326, respectively. Therefore, the first slurry S1 can be heated by the first heater 410 when the first slurry S1 flows through the first pipe 316. Similarly, the second slurry S2 can be heated by the second heater 420 when the second slurry S2 flows through the second pipe 326. The first and second heaters 410 and 420 are independently controlled. In this way, the temperature of the heated first slurry S1 can be independent of the temperature of the heated second slurry S2. In greater detail, the first and second heaters 410 and 420 can heat the respective first and second slurries S1 and S2 in such a way that the heated first and second slurries S1 and S2 have different temperatures. In some embodiments, the heated first slurry S1 has a higher temperature than the heated second slurry S2. In other embodiments, the heated first slurry S1 has a lower temperature than the heated second slurry S2.

In some embodiments, the CMP tool 10 includes first and second valves 318 and 328 in the respective pipes 316 and 326. The first valve 318 may be used for regulating the flow rate of the first slurry S1 and/or for turning on/off the flow of the first slurry S1. Similarly, the second valve 328 may be used for regulating the flow rate of the second slurry S2 and/or for turning on/off the flow of the second slurry S2. Dispensing the second slurry S2 can be performed after dispensing the first slurry S1 by using control of the first and second valves 318 and 328. As a result, performing a coarse CMP process followed by a fine CMP process in the same wafer carrier 200 can be achieved.

In some embodiments, the first and second valves 318 and 328 are independently controlled using individual valve controllers 510 and 520. In this way, a dispensing duration of the first slurry S1 can be independent of a dispensing duration of the second slurry S2. In greater detail, the first and second valves 318 and 328 can turn on/off the flow of the respective first and second slurries S1 and S2 in such a way that the first and second slurries S1 and S2 have different dispensing durations. In some embodiments, the first slurry S1 has a longer dispensing duration than the second slurry S2. In other embodiments, the first slurry S1 has a shorter dispensing duration than the heated second slurry S2.

With the first slurry S1 and the second slurry S2 having different sizes, independently controlled temperatures and independently controlled dispensing duration, significant flexibility for the CMP process can be achieved, and customized requirements for different CMP processes can be satisfied. This not only leads to an improvement in the polishing performance, but also to a reduction in cost, such as slurry waste.

In some embodiments, the CMP tool 10 includes a pressure sensor 610 and an analyzer 640. The pressure sensor 610 is disposed in the wafer carrier 200 to detect a pressure in the wafer carrier 200. The analyzer 640 is electrically connected to the pressure sensor 610 and can compare the detected pressure to a predetermined pressure. In some embodiments, the analyzer 640 is a central processing unit (CPU) in a computer or the like. In some embodiments, the predetermined pressure may be a minimal pressure or a maximal pressure of an acceptable pressure range for performing the coarse CMP process or the fine CMP process. The coarse CMP process and/or the fine CMP process is started or halted in response to the pressure comparing result generated from the analyzer 640, as described in greater detail below. In some embodiments, the predetermined pressure is stored in a non-transitory computer-readable media. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

In some embodiments, the pressure sensor 610 is disposed on the backing film 220 so as to maximize a distance between the pressure sensor 610 and the polishing pad 140.

In this way, the pressure sensor 610 obtains the slurry pressure as long as an inner space S inside the wafer carrier 200 is filled with the slurry.

In some embodiments, the CMP tool 10 includes a slurry concentration sensor 620. The slurry concentration sensor 620 is disposed in the wafer carrier 200 to detect a slurry concentration in the wafer carrier 200. The analyzer 640 is electrically connected to the slurry concentration sensor 620 and can compare the detected slurry concentration to a predetermined slurry concentration. In some embodiments, the predetermined slurry concentration may be a minimal slurry concentration or a maximal slurry concentration of an acceptable slurry concentration range for performing the coarse CMP process or the fine CMP process. The coarse CMP process and/or the fine CMP process is started or halted in response to the concentration comparing result generated from the analyzer 640, as described in greater detail below. In some embodiments, the predetermined slurry concentration is stored in a non-transitory computer-readable media. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

In some embodiments, the slurry concentration sensor 620 is disposed on the backing film 220 so as to maximize a distance between the slurry concentration sensor 620 and the polishing pad 140. In this way, the slurry concentration sensor 620 obtains the slurry pressure as long as an inner space S inside the wafer carrier 200 is filled with the slurry.

In some embodiments, the CMP tool 10 includes a temperature sensor 630. The temperature sensor 630 is disposed in the wafer carrier 200 to detect a temperature in the wafer carrier 200. The analyzer 640 is electrically connected to the temperature sensor 630 and can compare the detected temperature to a predetermined temperature. In some embodiments, the predetermined temperature may be a minimal temperature or a maximal temperature of an acceptable temperature range for performing the coarse CMP process or the fine CMP process. The coarse CMP process and/or the fine CMP process is started or halted in response to the temperature comparing result generated from the analyzer 640, as described in greater detail below. In some embodiments, the predetermined temperature is stored in a non-transitory computer-readable media. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

In some embodiments, the temperature sensor 630 is disposed adjacent to a slurry dispensing nozzle (e.g., the first nozzle 312). In this way, the temperature sensor 630 can obtain a temperature close to the initial temperature of the heated slurry. Because the slurry dispensing nozzle is disposed on a bottom region of the retaining ring 230 farer away from the backing film 220 and closer to the polishing pad 140, the temperature sensor 630 adjacent to the slurry dispensing nozzle is disposed on a bottom region of the retaining ring 230. As such, the temperature sensor 630 is at a lower height than the pressure sensor 610 and the slurry concentration sensor 620 that are attached to the backing film 220.

Figure 2:
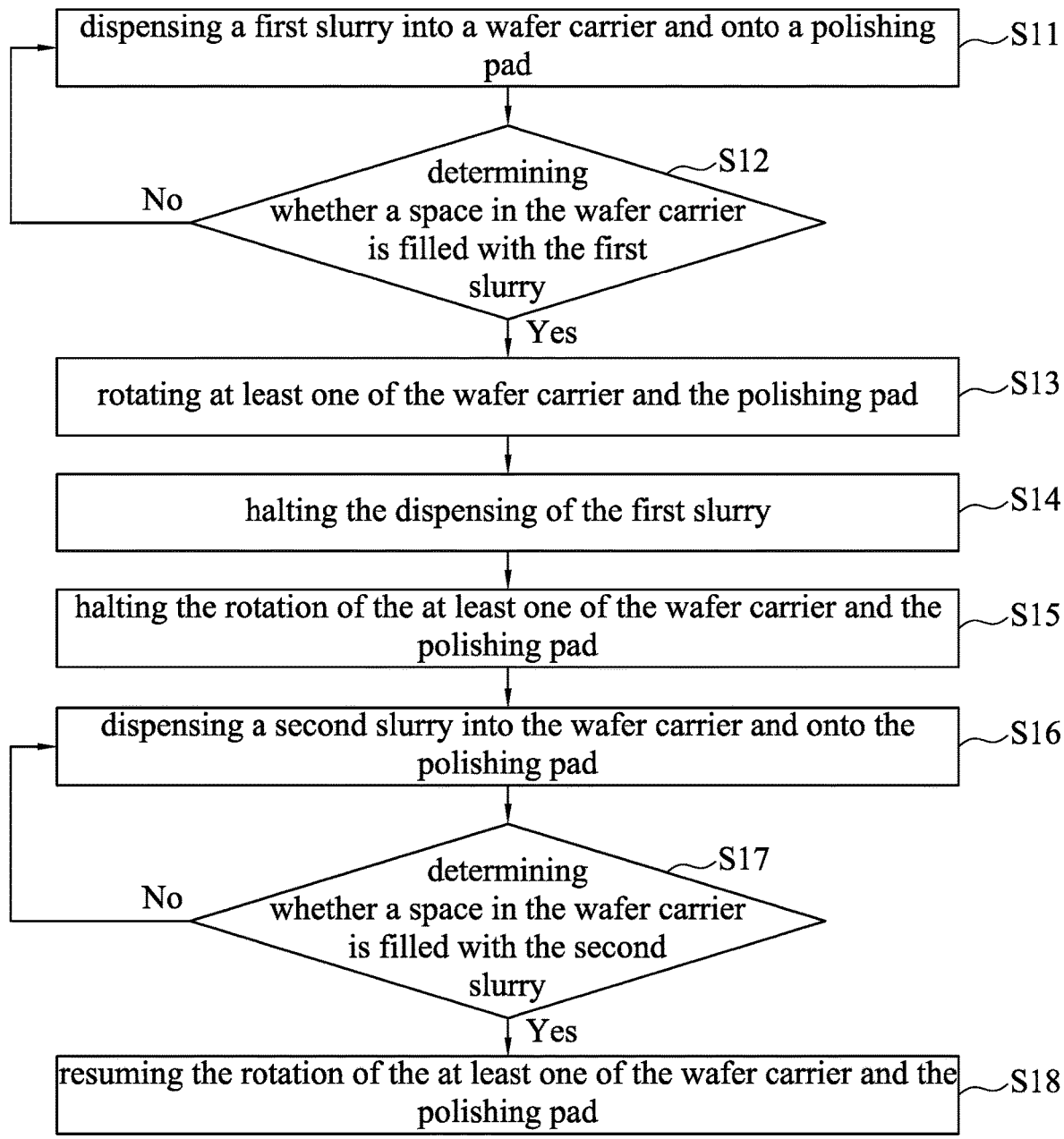
FIG. 2 is a flowchart of a CMP method in accordance with some embodiments.

The FIG. 2 is a flowchart of a CMP method M in accordance with some embodiments. FIGS. 3-8 illustrate the CMP method M at various stages in accordance with some embodiments. The CMP method M may be implemented in a fab for planarizing a surface layer on a wafer. It is understood that additional operations may be implemented before, during, and after the method M, and some of the operations may be replaced, eliminated, or moved around for additional embodiments of the method M.

Figure 3:
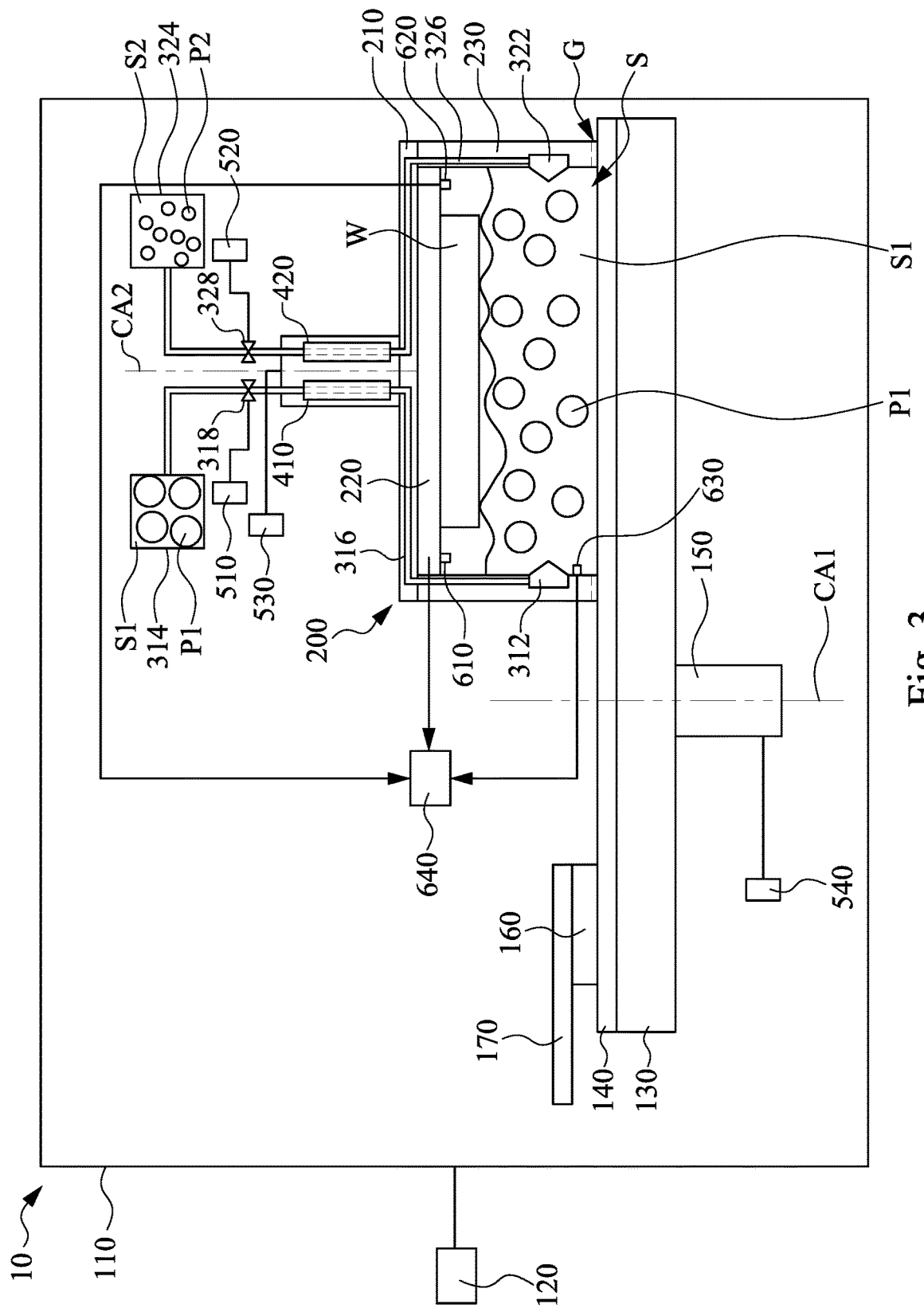
FIGS. 3-8 illustrate the CMP method M at various stages in accordance with some embodiments.

The method M begins at block S11 where a first slurry is dispensed into a wafer carrier and onto a polishing pad. With reference to FIG. 3, in some embodiments of block S11, the first valve controller 510 turns on the first valve 318 to allow the first slurry S1 to flow from the first slurry source 314 to the first nozzle 312, which in turn allows the first nozzle 312 to dispense the first slurry S1 into the inner space S inside the wafer carrier 200.

In some embodiments, the second valve 328 is kept turned off during the first valve 318 is in a turned-on state. That is, the second nozzle 322 does not dispense the second slurry S2 during dispensing the first slurry S1. In this way, unwanted mixing of the first and second slurries S1 and S2 can be prevented during the following coarse CMP process.

In some embodiments, the polishing pad 140 and the wafer carrier 200 remain stationary without rotation until the inner space S of the wafer carrier 200 is filled with the first slurry S1. In this way, the coarse CMP process can begin after the entire wafer W is immersed in the first slurry S1. It is understood that if the polishing pad 140 and the wafer carrier 200 rotates before the inner space S of the wafer carrier 200 is filled with the first slurry S1, some regions of the wafer W would be polished while some regions would be not, thus leading to poor CMP performance, such as increased surface roughness of the wafer W. However, because the polishing pad 140 and the wafer carrier 200 remain stationary without rotation until the inner space S of the wafer carrier 200 is filled with the first slurry S1, the CMP performance can be improved. For example, the surface roughness of the wafer W can be reduced.

In some embodiments, the first slurry S1 can be heated by the first heater 410 prior to dispensing into the inner space S of the wafer carrier 200, which in turn will result in improved CMP performance. In some embodiments, the heated first slurry S1 has temperature in a range from about 10° C. to about 80° C. If the temperature of the first slurry S1 is higher than about 80° C., the resulting polished wafer might have increased defects. If the temperature of the first slurry S1 is lower than about 10° C., the CMP time duration might be unwantedly lengthy.

The method M then proceeds to at block S12 by determining whether a space in the wafer carrier is filled with the first slurry. In some embodiments, determining whether the inner space S of the wafer carrier 200 is filled is performed using the pressure sensor 610 and the analyzer 640. In greater detail, the pressure sensor 610 can detect the pressure in the inner space S of the wafer carrier 200 during dispensing the first slurry S1, the analyzer 640 then compares the detected pressure to a predetermined pressure, which is a minimal pressure of an acceptable pressure range for performing the coarse CMP process. When the detected pressure is higher than or equal to (i.e., not less than) the minimal acceptable pressure, the method M then proceeds to block S13 to perform the coarse CMP process. When the detected pressure is lower than the minimal acceptable pressure, the method does not proceed to block S13. That is, the coarse CMP process is not performed until the detected pressure is higher than or equal to the minimal acceptable pressure.

Figure 4:
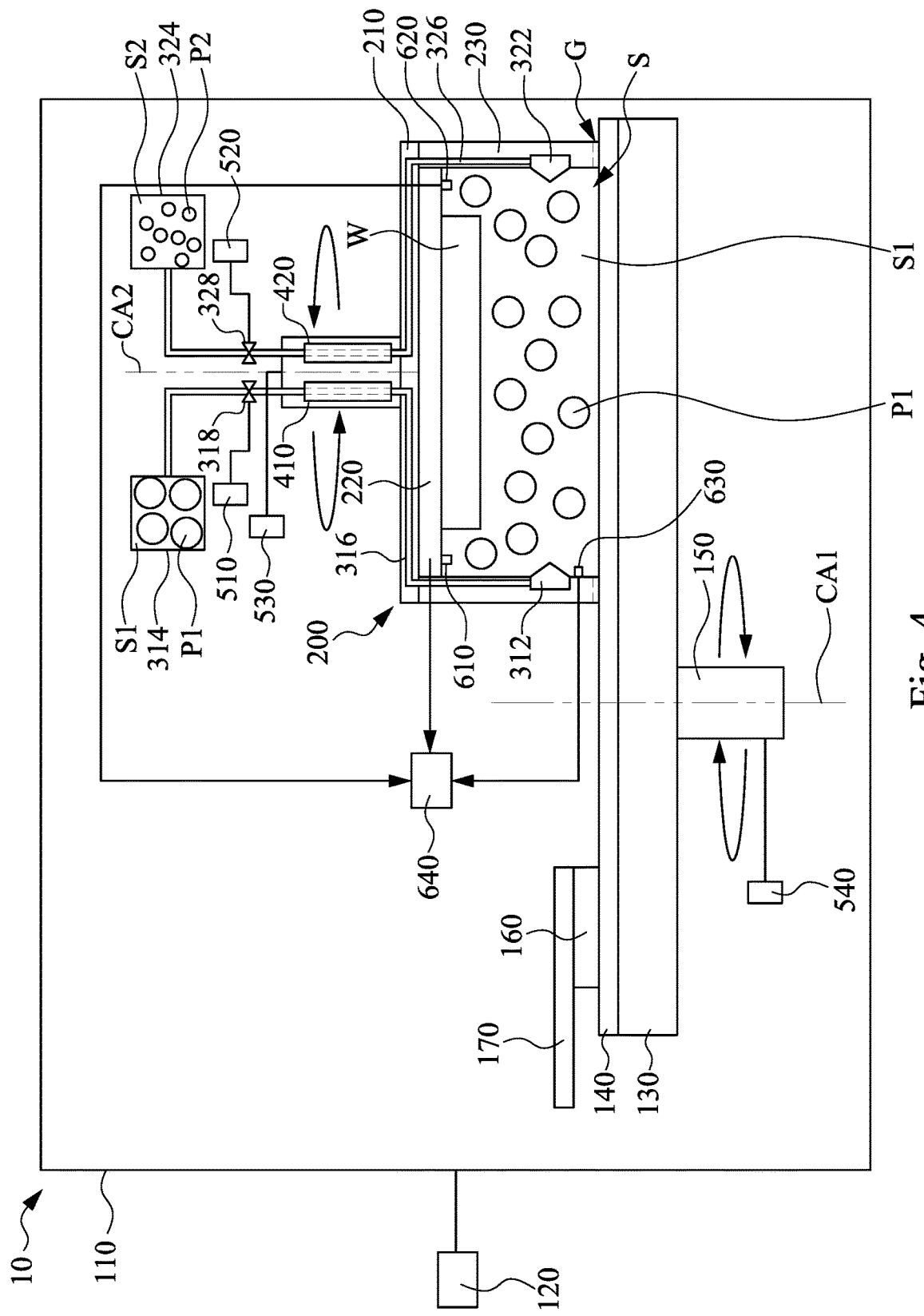

In some embodiments of block S13, referring to FIG. 4, at least one of the wafer carrier 200 and the polishing pad 140 are rotated to carry out the coarse CMP process using the first slurry S1 filled in the inner space S of the wafer carrier 200. In some embodiments, the wafer carrier 200 and the polishing pad 140 are counter rotated to improve the polishing performance. Rotation of the wafer carrier 200 and the polishing pad 140 can be respectively controlled using the controllers 530 and 540. In some embodiments, the controllers 530 and 540 are electrically connected to the analyzer 640, so that the controllers 530 and 540 can begin the rotation of the wafer carrier 200 and the polishing pad 140 in response to the detected pressure is higher than or equal to the minimal acceptable pressure.

In some embodiments, during rotating the wafer carrier 200 and the polishing pad 140 (i.e., performing the coarse CMP process), the pressure sensor 610 detects the pressure in the inner space S of the wafer carrier 200, the concentration sensor 620 detects the concentration of the first slurry S1 in the inner space S of the wafer carrier 200, and the temperature sensor 630 detects the temperature of the first slurry S1 in the inner space S of the wafer carrier 200. The analyzer 640 can determine whether the detected pressure is outside a predetermined acceptable pressure range, whether the detected concentration of the first slurry S1 is outside a predetermined acceptable concentration range, and whether the detected temperature is outside a predetermined acceptable temperature range.

As long as at least one of the detected pressure, the detected temperature or the detected slurry concentration is outside a predetermined acceptable range for the coarse CMP process, the rotation of the wafer carrier 200 and the polishing pad 140 is halted. Halting the rotation of the wafer carrier 200 and the polishing pad 140 is performed using the controllers 530 and 540. For example, the controllers 530 and 540 can halt the rotation of the wafer carrier 200 and the polishing pad 140 in response to the detected pressure, temperature or slurry concentration falling outside their acceptable ranges for the coarse CMP process. After halting the rotation of the wafer carrier 200 and the polishing pad 140, the wafer W can be inspected automatedly or manually to check whether an abnormal condition exists and/or whether the wafer W is scratched due to the abnormal CMP condition. In this way, the wafer scratching risk can be reduced.

Figure 5:
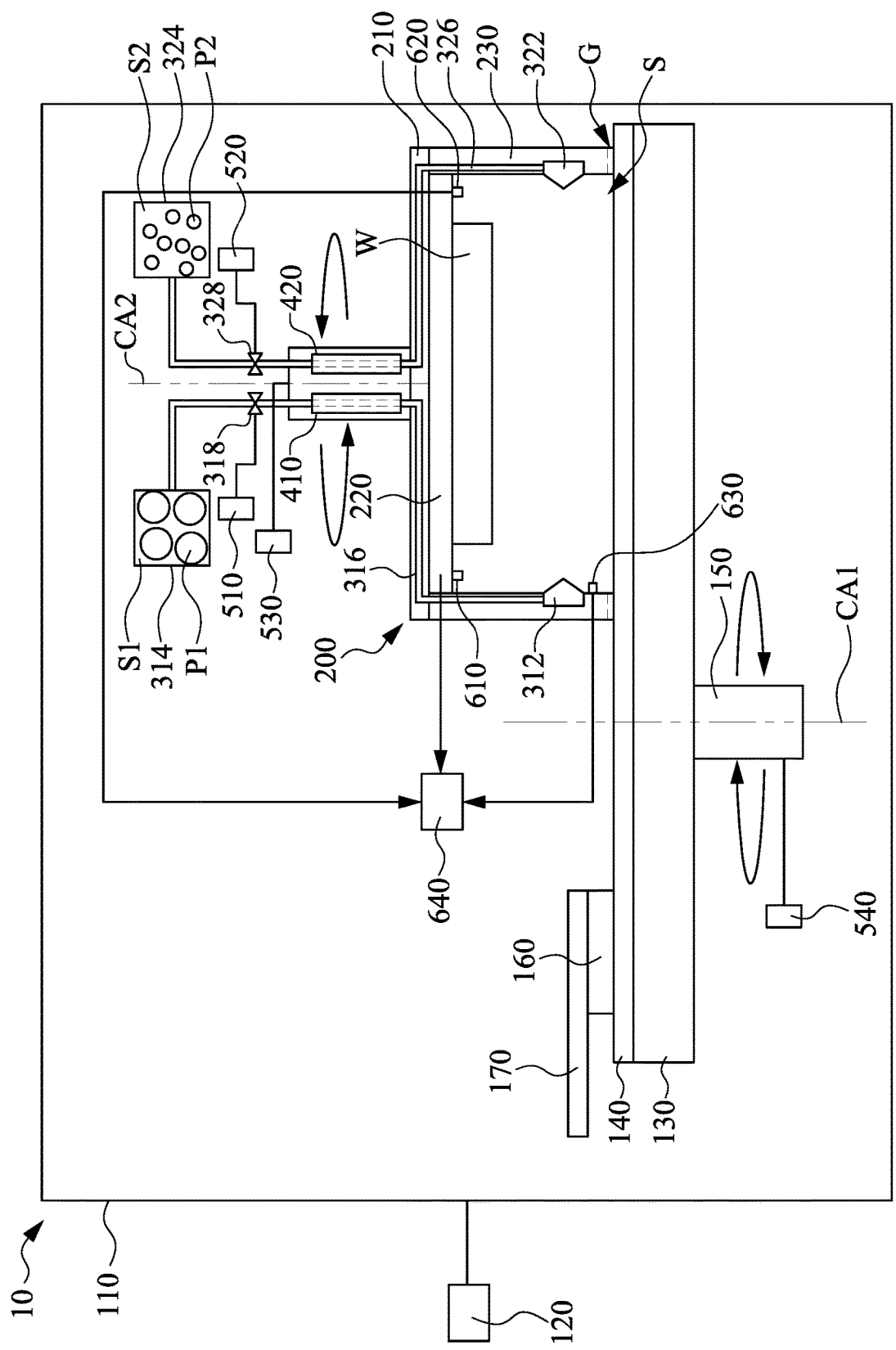

The method M then proceeds to at block S14 where dispensing of the first slurry is halted. In some embodiments of block S14, halting the dispensing of the first slurry S1 can be performed by turning off the first valve 318. For example, the first valve controller 510 can turn off the first valve 318 to stop dispensing the first slurry S1 into the inner space S of the wafer carrier 200. After halting the dispensing of the first slurry S1, the rotation of the wafer carrier 200 and the polishing pad 140 continues such that an interior S of the wafer carrier 200 is free of the first slurry S1. In greater detail, rotation of the wafer carrier 200 and the polishing pad 140 can speed up discharging the first slurry S1 into an exterior of the wafer carrier 200 through the gaps S between the retaining ring 230 and the polishing pad 140. The result is illustrated in FIG. 5.

The method M then proceeds to at block S15 where rotation of the wafer carrier 200 and the polishing pad 140 is halted. In some embodiments, halting the rotation of the wafer carrier 200 and the polishing pad 140 is performed using the controllers 530 and 540. In greater detail, the controllers 530 and 540 can halt the rotation of the wafer carrier 200 and the polishing pad 140 after halting the dispensing of the first slurry S1. In some embodiments, a time interval exists between halting the rotation of the wafer carrier 200 and the polishing pad 140 and halting the dispensing of the first slurry S1. The time interval is predetermined to ensure that inner space S of the wafer carrier 200 is free of the first slurry S1.

Figure 6:
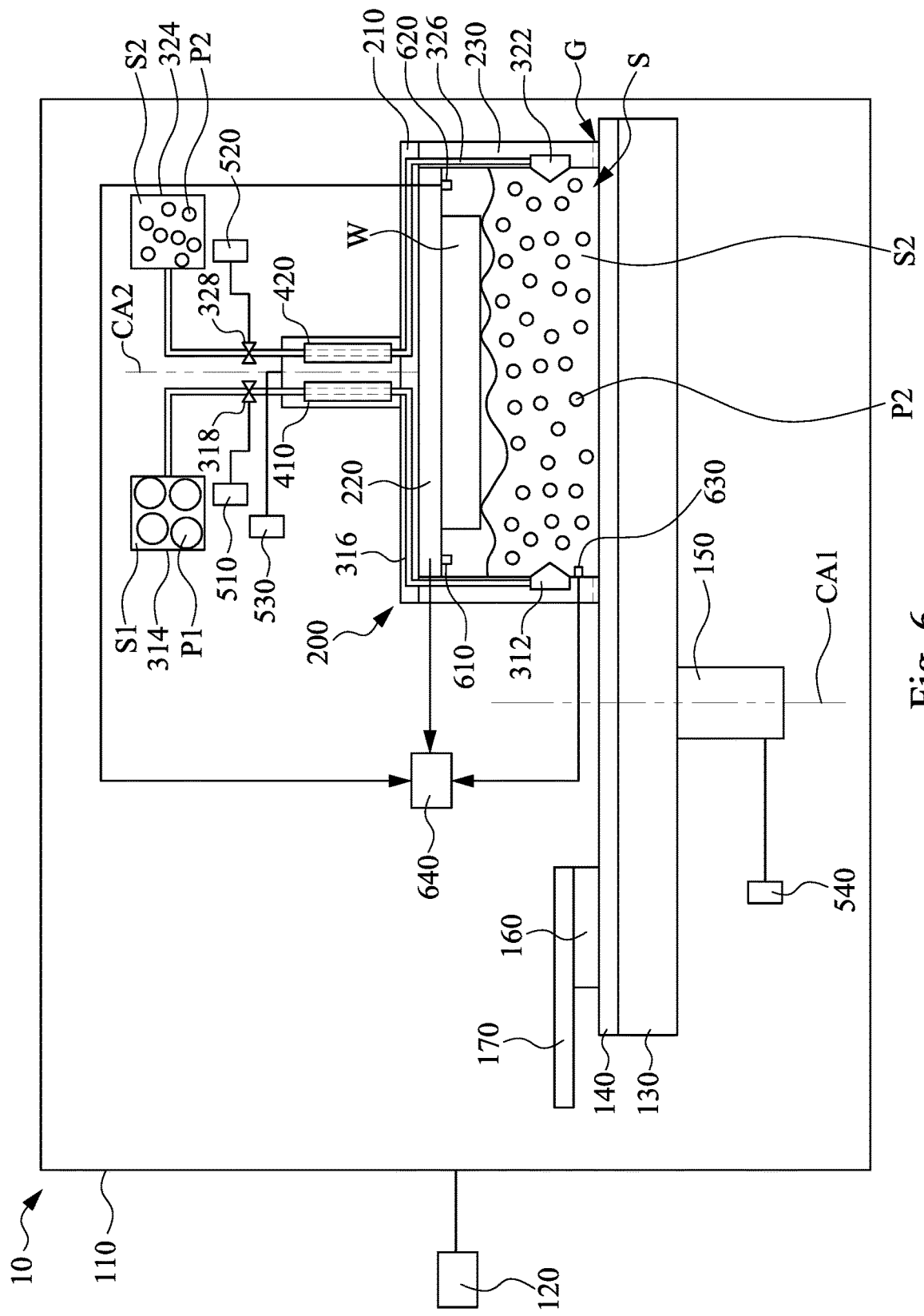

The method M begins at block S16 where a second slurry is dispensed into the wafer carrier and onto the polishing pad. With reference to FIG. 6, in some embodiments of block S16, the second valve controller 520 turns on the second valve 328 to allow the second slurry S2 to flow from the second slurry source 324 to the second nozzle 322, which in turn allows the second nozzle 322 to dispense the second slurry S2 into the inner space S inside the wafer carrier 200.

In some embodiments, the first valve 318 is kept turned off during the second valve 328 is in a turned-on state. That is, the first nozzle 312 does not dispense the first slurry S1 during dispensing the second slurry S2. In this way, unwanted mixing of the first and second slurries S1 and S2 can be prevented during the following fine CMP process.

In some embodiments, the polishing pad 140 and the wafer carrier 200 remain stationary without rotation until the inner space S of the wafer carrier 200 is filled with the second slurry S2. In this way, the fine CMP process can begin after the entire wafer W is immersed in the second slurry S2. It is understood that if the polishing pad 140 and the wafer carrier 200 rotates before the inner space S of the wafer carrier 200 is filled with the second slurry S2, some regions of the wafer W would be polished while some regions would be not, thus leading to poor CMP performance, such as increased surface roughness of the wafer W. However, because the polishing pad 140 and the wafer carrier 200 remain stationary without rotation until the inner space S of the wafer carrier 200 is filled with the second slurry S2, the CMP performance can be improved. For example, the surface roughness of the wafer W can be reduced.

In some embodiments, the second slurry S2 can be heated by the second heater 420 prior to dispensing into the inner space S of the wafer carrier 200, which in turn will result in improved CMP performance. In some embodiments, the heated second slurry S2 has temperature in a range from about 10° C. to about 80° C. If the temperature of the second slurry S2 is higher than about 80° C., the resulting polished wafer might have increased defects. If the temperature of the second slurry S2 is lower than about 10° C., the CMP time duration might be unwantedly lengthy.

Figure 7:
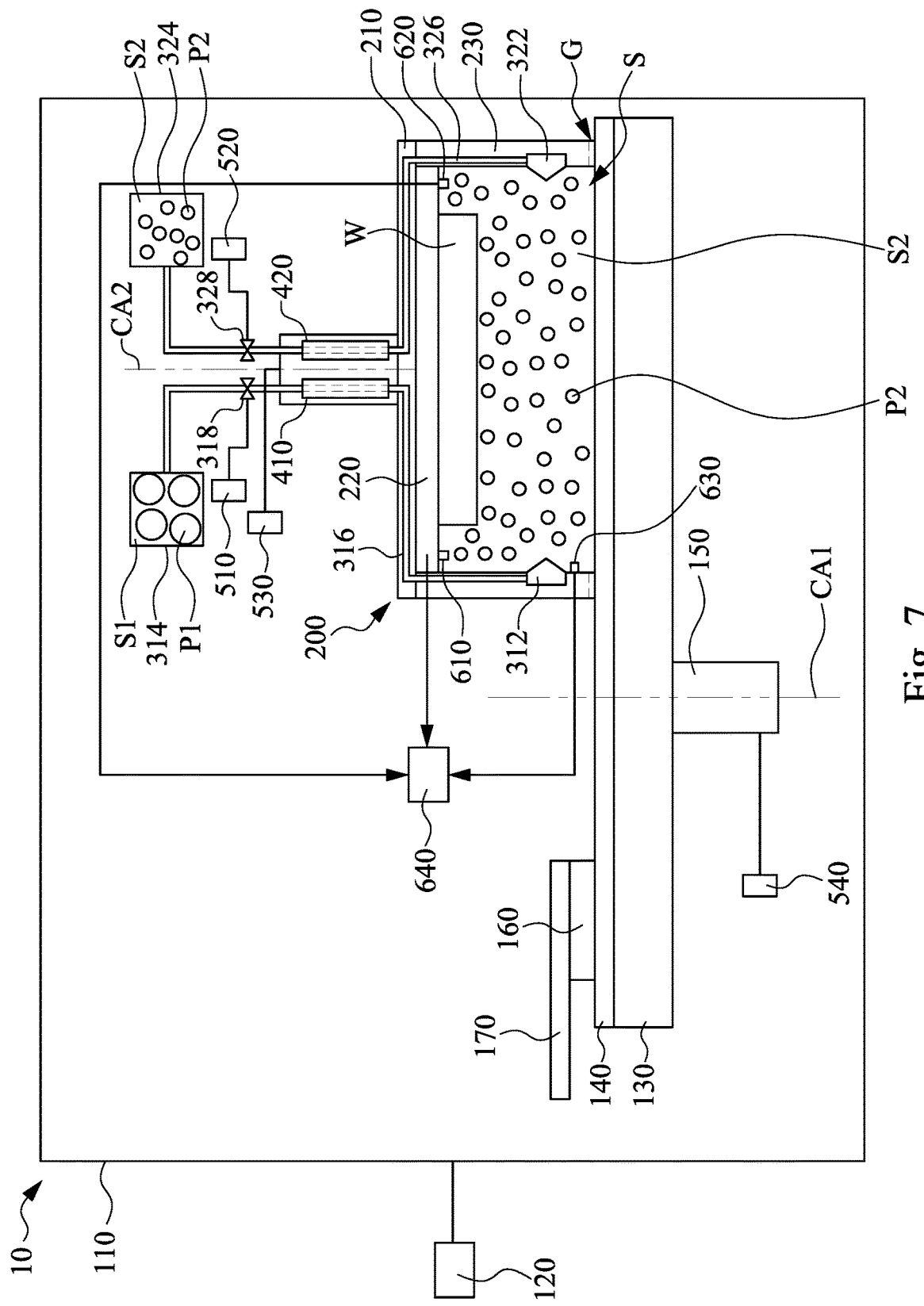

The method M then proceeds to at block S17 by determining whether the space in the wafer carrier is filled with the second slurry, as illustrated in FIG. 7. In some embodiments, determining whether the inner space S of the wafer carrier 200 is filled is performed using the pressure sensor 610 and the analyzer 640. In greater detail, the pressure sensor 610 can detect the pressure in the inner space S of the wafer carrier 200 during dispensing the second slurry S2, the analyzer 640 then compares the detected pressure to a predetermined pressure, which is a minimal pressure of an acceptable pressure range for performing the fine CMP process. When the detected pressure is higher than or equal to (i.e., not less than) the minimal acceptable pressure, the method M then proceeds to block S18 to perform the fine CMP process. When the detected pressure is lower than the minimal acceptable pressure, the method does not proceed to block S18. That is, the fine CMP process is not performed until the detected pressure is higher than or equal to the minimal acceptable pressure.

Figure 8:
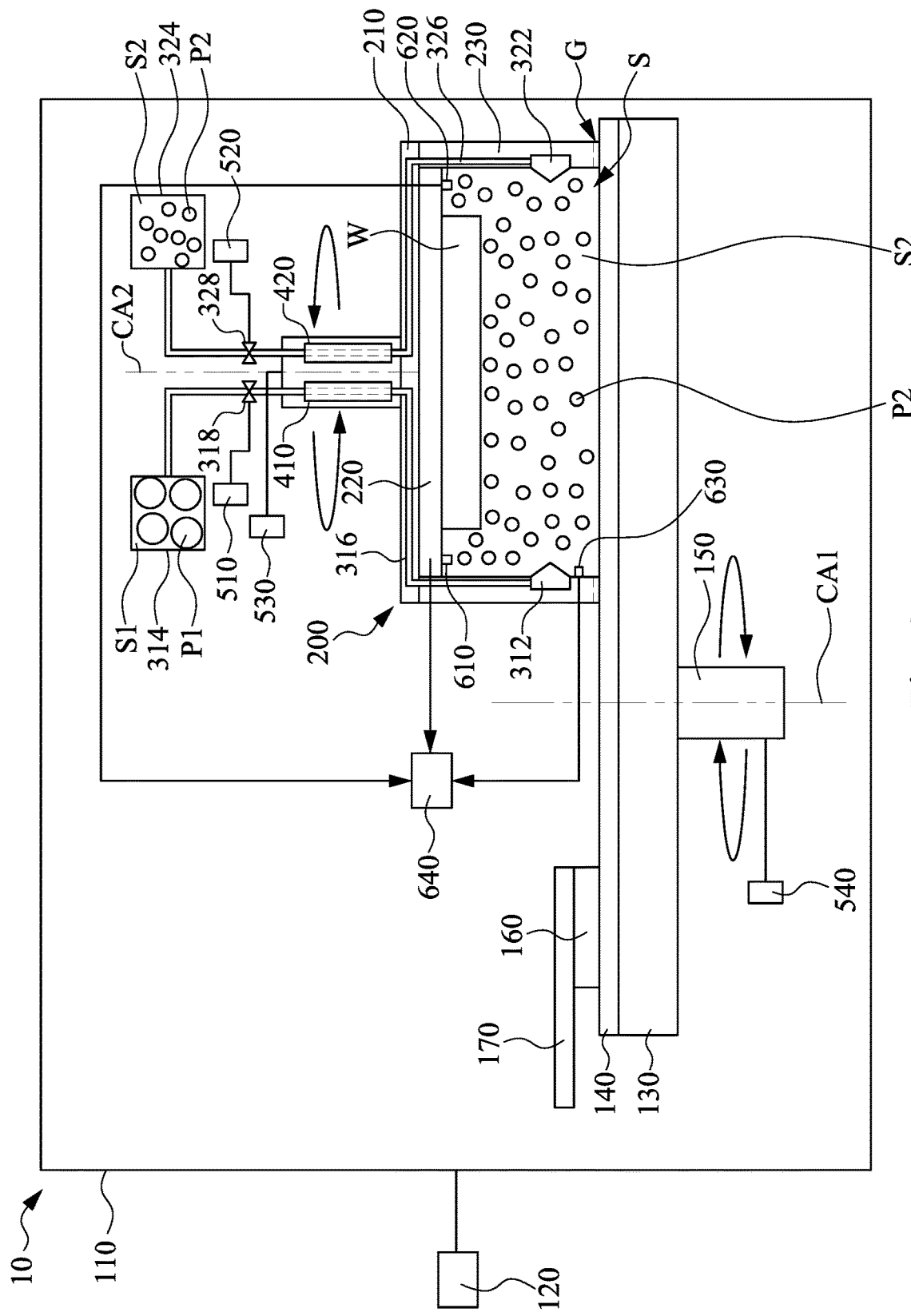

In some embodiments of block S18, referring to FIG. 8, at least one of the wafer carrier 200 and the polishing pad 140 are rotated to carry out the fine CMP process using the second slurry S2 filled in the inner space S of the wafer carrier 200. In some embodiments, the wafer carrier 200 and the polishing pad 140 are counter rotated to improve the polishing performance. Rotation of the wafer carrier 200 and the polishing pad 140 can be respectively controlled using the controllers 530 and 540. In some embodiments, the controllers 530 and 540 are electrically connected to the analyzer 640, so that the controllers 530 and 540 can begin the rotation of the wafer carrier 200 and the polishing pad 140 in response to the detected pressure is higher than or equal to the minimal acceptable pressure.

In some embodiments, during rotating the wafer carrier 200 and the polishing pad 140 (i.e., performing the coarse CMP process), the pressure sensor 610 detects the pressure in the inner space S of the wafer carrier 200, the concentration sensor 620 detects the concentration of the second slurry S2 in the inner space S of the wafer carrier 200, and the temperature sensor 630 detects the temperature of the second slurry S2 in the inner space S of the wafer carrier 200. The analyzer 640 can determine whether the detected pressure is outside a predetermined acceptable pressure range, whether the detected concentration of the second slurry S2 is outside a predetermined acceptable concentration range, and whether the detected temperature is outside a predetermined acceptable temperature range.

As long as at least one of the detected pressure, the detected temperature and the detected slurry concentration is outside a predetermined acceptable range for the coarse CMP process, the rotation of the wafer carrier 200 and the polishing pad 140 is halted. Halting the rotation of the wafer carrier 200 and the polishing pad 140 is performed using the controllers 530 and 540. For example, the controllers 530 and 540 can halt the rotation of the wafer carrier 200 and the polishing pad 140 in response to the detected pressure, temperature or slurry concentration falling outside their acceptable ranges for the coarse CMP process. After halting the rotation of the wafer carrier 200 and the polishing pad 140, the wafer W can be inspected automatedly or manually to check whether an abnormal condition exists and/or whether the wafer W is scratched due to the abnormal CMP condition. In this way, the wafer scratching risk can be reduced.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that coarse and fine CMP processes performed sequentially in a single wafer carrier results in improved flexibility for the CMP process, satisfied customized requirements for different CMP processes, and/or slurry waste reduction. Another advantage is that sensors (e.g., the pressure sensor, the temperature sensor and/or the concentration sensor) inside the wafer carrier results in the real-time monitor of the coarse CMP process and/or the fine CMP process, which in turn will reduce the wafer scratching risk.

In some embodiments, the CMP method includes holding a wafer in a carrier over a polishing pad, dispensing a first slurry comprising a plurality of first abrasive particles into the carrier, rotating at least one of the carrier and the polishing pad, halting the dispensing of the first slurry, and dispensing a second slurry into the carrier after halting the dispensing of the first slurry, wherein the second slurry comprises a plurality of second abrasive particles smaller than the first abrasive particles.

In some embodiments, a CMP method includes holding a wafer in a wafer carrier over a polishing pad, dispensing a first slurry into the wafer carrier, detecting a first pressure in the wafer carrier after dispensing the first slurry into the wafer carrier, comparing the detected first pressure to a first predetermined pressure, and responsive to the detected first pressure higher than or equal to the first predetermined pressure, rotating at least one of the wafer carrier and the polishing pad.

In some embodiments, a CMP apparatus includes a polishing pad, a wafer carrier, first and second nozzles, and first and second slurry sources. The wafer carrier comprises a carrier head, a backing film under the carrier head, and a retaining ring around the backing film. The first and second nozzles are disposed on the retaining ring. The first and second slurry sources fluidly connected to the first and second nozzles, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chemical mechanical polishing (CMP) method, comprising:
    holding a wafer in a carrier over a polishing pad;
    heating a first slurry to a first temperature;
    dispensing the first slurry into the carrier by using a nozzle disposed within the carrier and below the wafer, the first slurry comprising a plurality of first abrasive particles, wherein when the wafer is held in the carrier, a bottom surface of the wafer is above an entirety of the nozzle;
    detecting the first temperature of the first slurry using a temperature sensor disposed below the nozzle;
    rotating the carrier, the polishing pad or a combination thereof;
    halting the dispensing of the first slurry; and
    dispensing a second slurry into the carrier after halting the dispensing of the first slurry, wherein the second slurry comprises a plurality of second abrasive particles smaller than the first abrasive particles.

2. The CMP method of claim 1, wherein after halting the dispensing of the first slurry, the rotation of the carrier, the polishing pad or the combination thereof continues such that an interior of the carrier is free of the first slurry.

3. The CMP method of claim 1, further comprising:
    halting the rotation of the carrier, the polishing pad or the combination thereof prior to dispensing the second slurry.

4. The CMP method of claim 3, further comprising:
    detecting a pressure in the carrier during dispensing the second slurry;
    comparing the detected pressure to a predetermined pressure; and
    resuming the rotation of the carrier, the polishing pad or the combination thereof when the detected pressure is higher than or equal to the predetermined pressure.

5. The CMP method of claim 3, wherein halting the dispensing of the first slurry is performed prior to halting the rotation of the carrier, the polishing pad or the combination thereof.

6. The CMP method of claim 1, further comprising:
    heating the second slurry to a second temperature different from the first temperature.

7. The CMP method of claim 6, wherein heating the second slurry is performed prior to dispensing the second slurry into the carrier.

8. The CMP method of claim 1, further comprising:
    detecting a third temperature in the carrier during the rotation of the carrier, the polishing pad or the combination thereof; and
    halting the rotation of the carrier, the polishing pad or the combination thereof when the detected third temperature is outside a predetermined temperature range.

9. The CMP method of claim 1, further comprising:
    detecting a pressure in the carrier during the rotation of the carrier, the polishing pad or the combination thereof; and
    halting the rotation of the carrier, the polishing pad or the combination thereof when the detected pressure is outside a predetermined pressure range.

10. The CMP method of claim 1, further comprising:
    detecting a concentration of the first slurry in the carrier during the rotation of the carrier, the polishing pad or the combination thereof; and
    halting the rotation of the carrier, the polishing pad or the combination thereof when the detected concentration of the first slurry is outside a predetermined concentration range.

11. The CMP method of claim 1, further comprising:
    detecting a concentration of the second slurry in the carrier during the rotation of the carrier, the polishing pad or the combination thereof; and
    halting the rotation of the carrier, the polishing pad or the combination thereof when the concentration of the second slurry is outside a predetermined concentration range.

12. The CMP method of claim 1, wherein the bottom surface of the wafer and the nozzle have a height difference greater than a diameter of the plurality of first abrasive particles.

13. A chemical mechanical polishing (CMP) method, comprising:
    holding a wafer in a wafer carrier over a polishing pad;
    dispensing a first slurry into the wafer carrier;
    detecting, by using a pressure sensor disposed within the wafer carrier and in contact with the dispensed first slurry, a first pressure in the wafer carrier after dispensing the first slurry into the wafer carrier, wherein the pressure sensor has a bottom surface non-overlapping with the wafer;
    comparing the detected first pressure to a first predetermined pressure; and
    responsive to the detected first pressure higher than or equal to the first predetermined pressure, rotating the wafer carrier, the polishing pad or a combination thereof.

14. The CMP method of claim 13, further comprising:
    detecting a second pressure in the wafer carrier during the rotation of the wafer carrier, the polishing pad or the combination thereof; and responsive to the detected second pressure lower than the first predetermined pressure, halting the rotation of the wafer carrier, the polishing pad or the combination thereof.

15. The CMP method of claim 13, further comprising:
detecting a second pressure in the wafer carrier during the rotation of the wafer carrier, the polishing pad or the combination thereof; and
responsive to the detected second pressure exceeds a second predetermined pressure higher than the first predetermined pressure, halting the rotation of the wafer carrier, the polishing pad or the combination thereof.

16. The CMP method of claim 13, further comprising:
halting the dispensing of the first slurry; and
halting the rotation of the wafer carrier, the polishing pad or the combination thereof after halting the dispensing of the first slurry.

17. The CMP method of claim 16, further comprising:
after halting the rotation of the wafer carrier, the polishing pad or the combination thereof, dispensing a second slurry into the wafer carrier.

18. The CMP method of claim 17, further comprising:
detecting a second pressure in the wafer carrier after dispensing the second slurry into the wafer carrier;
comparing the detected second pressure to a second predetermined pressure; and
responsive to the detected second pressure higher than or equal to the second predetermined pressure, resuming the rotation of the wafer carrier, the polishing pad or the combination thereof.

19. A CMP method, comprising:
holding a wafer in a carrier over a polishing pad;
heating a first slurry to a first temperature using a first heater before dispensing the first slurry into the carrier;
dispensing the first slurry into the carrier through a first nozzle disposed at a first inner sidewall of the carrier;
detecting the first temperature of the first slurry using a temperature sensor disposed below the first nozzle;
rotating the carrier, the polishing pad or a combination thereof;
halting the dispensing of the first slurry; and
dispensing a second slurry into the carrier after halting the dispensing of the first slurry, wherein the second slurry has a different temperature than the first slurry, wherein the second slurry is dispensed through a second nozzle at a second inner sidewall of the carrier opposite to the first inner sidewall of the carrier, wherein the first nozzle and the second nozzle are entirely below a bottom surface of the wafer.

20. The CMP method of claim 19, further comprising:
heating the second slurry using a second heater before dispensing the second slurry into the carrier, wherein the first heater and the second heater are independently controlled.

* * * * *